Nov. 27, 1962 M. A. SLAATS ETAL 3,066,188
UNBALANCED AUTOTRANSFORMER AUDIO AMPLIFIER
Filed Aug. 14, 1959
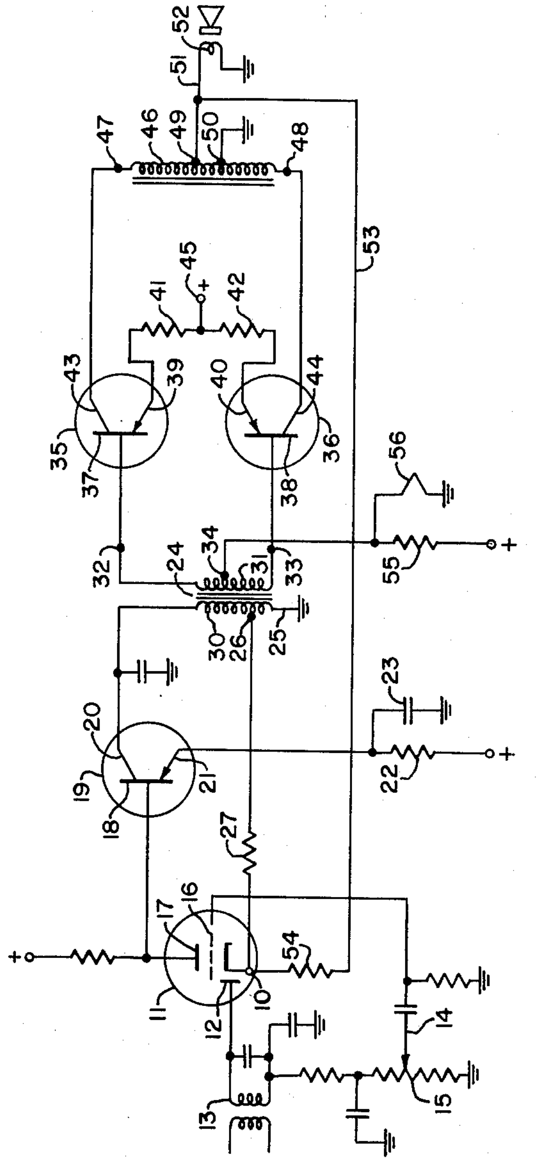
*INVENTOR*
MATTHEW A. SLAATS
PETER S. MANSON
BY *Robert T. Killman*
*ATTORNEY*

3,066,188

UNBALANCED AUTOTRANSFORMER AUDIO AMPLIFIER

Matthew A. Slaats, Owings Mills, and Peter S. Manson, Glen Arm, Md., assignors to The Bendix Corporation, a corporation of Delaware Filed Aug. 14, 1959, Ser. No. 833,728
7 Claims. (Cl. 179—1)

This invention relates generally to amplifiers and more particularly to amplifiers such as audio amplifiers which have an autotransformer coupling to the load impedance.

Power amplifiers employing an output transformer to match the impedance of the amplifier device to the load have been in use for many years. In push-pull circuits the primary winding of a conventional transformer provides a convenient balanced impedance for connection to push-pull operated amplifier devices and as a means for coupling the load to the amplifier devices by means of one or more secondary windings. It has also been known in the past to use an autotransformer connection in which the end terminals of a single winding wound on a transformer core have been connected to the amplifier devices with the center tap of that winding connected to a terminal of the direct current supply. By conecting two leads symmetrically spaced on opposite sides of the center tap and appropriately spaced therefrom the desired impedance match can be obtained for a load.

It is an object of the present invention to provide an improved autotransformer type output power amplifier.

Another object of the invention is to provide a single tap autotransformer output load connection for a power amplifier.

A still further object of the invention is to provide an autotransformer transistor power amplifier having improved driver and output circuits.

A still further object of the invention is to provide an extremely economical power amplifier having very low distortion and high power handling capabilities.

An additional object of the invention is to provide an amplifier with the foregoing characteristics which can use relatively low cost power transistors for the amplifier devices in the push-pull power amplifier circuit.

These and other objects of the invention will be apparent from the following detailed description taken in conjunction with the accompanying drawing wherein the single figure shows a schematic wiring diagram of a portion of a radio receiver for amplifying detected audio signals.

The present invention achieves the utmost simplicity and economy in an autotransformer amplifier output circuit without sacrificing power handling capability or increasing distortion by providing two taps on a single winding intermediate the end terminals of the winding, one tap being a connection for direct current to flow through the winding to supply the push-pull amplifier devices connected thereto and the second tap being a connection for the output load device such as the loud speaker voice coil. These taps are arranged off center in a manner to provide balanced operation relative to the current supply terminal and are driven by an unbalanced driver transformer in a manner to compensate for the different efficiencies of the two halves of the transformer, one of which operates as a conventional two-winding transformer, the other half of which operates as an autotransformer. This driver circuit is a low impedance source to enhance the characteristics of the amplifier when employed with relatively low cost power transistors which exhibit a high degree of curvature in the collector-base current characteristic.

Referring now to the drawing, an audio section of a radio receiver is shown comprising a detector-audio amplifier vacuum tube 11 having a diode anode 12 coupled to an IF transformer 13. Audio modulation on the received signal is recovered in the conventional detector circuit including diode 12 and appears at a tap 14 on a volume control potentiometer 15. Audio signals at tap 14 are applied to a grid 16 and appear at plate terminal 17. The plate terminal 17 is directly connected to a base 18 of a driver transistor 19. The transistor 19 has an emitter 21 which is connected to a positive voltage source through a resistor 22 bypassed by capacitor 23. The transistor 19 has a collector 20 which is connected to a primary winding 30 of a driver transformer 24. The winding 30 has a terminal connected to ground 25 and an intermediate tap 26 which is connected through a resistor 27 to cathode 10 of tube 11.

The driver transformer 24 has a secondary winding 31 having end terminals 32, 33 and an intermediate terminal 34. A pair of transistors 35, 36 are connected to be driven by the winding 31 by connecting terminal 32 to base 37 and terminal 33 to base 38. The transistors 35, 36 have emitters 39, 40 connected respectively through resistors 41, 42 to a positive pole 45 of the direct current supply.

The output from the transistors 35, 36 is obtained from collectors 43, 44 which are directly connected to a single winding transformer 46 having end terminals 47, 48. The winding 46 has two intermediate terminals 49, 50. The terminal 50 is connected to the negative pole of the direct current supply which may be the automobile chassis ground while the terminal 49 is connected by a single lead 51 to a grounded loud speaker load 52. If desired, overall feedback can be provided by a lead 53 connected through a resistor 54 to the cathode 10.

The bases 37, 38 are supplied with bias potential through the winding 31 from a voltage divider comprising resistors 55, 56 which are serially connected from the positive supply to ground. A suitable potential established at the junction of resistors 55, 56 by selecting the relative values thereof is applied to the bases 37, 38 by a connection from the junction of resistors 55, 56 to tap 34.

The output antotransformer winding 46 has taps 49, 50 which are arranged on either side of the electrical and physical center of the winding. In a particular instance the tap 50 may be spaced approximately 3% from the center of the winding 46 and the tap 39 may be spaced 3% on the other side of the electrical and physical center of the winding 46 and the tap 49 may be spaced supply terminal ground connection at tap 50, the transistor 35 operates into the portion of winding 46 between terminals 47 and 50 connected as a load impedance to collector 43. The output load 52 is connected across the portion of winding 46 between terminals 49 and 50 and thus transistor 35 operates into an autotransformer with respect to the load 52. The transistor 36 operates into the portion of winding 46 between terminals 48 and 50, while the load 52 is connected as previously noted between terminals 49 and 50. Thus, with respect to the load 52, transistor 36 operates into a conventional primary and secondary winding transformer, the two windings of which have a common terminal 50 and end terminals 48, 49. The autotransformer and a conventional two-winding transformer operate with different efficiencies and impedances. However, the unbalanced connection of the winding 46 with respect to transistors 34, 36 and load 52 compensates for the difference in efficiency and impedance between the two transformer types to provide equal load currents in load 52. With this arrangement the two transistors 35, 36 have symmetrical clipping levels and thus achieve a higher power output without objectionable distortion. In order that the unequal turns ratio resulting from this connection not induce low level distortion, an unbalanced drive signal is employed. In the arrangement shown, the tap 34 of driver transformer winding 31 is located approximately 3% above the electrical center of the winding 31 to provide a 6% unbalance between the terminals 32, 33 for the purpose of driving base 38 harder than the signal drive applied to the base 37. Any other form of unbalanced drive can also be used such as making resistor 41 larger than resistor 42.

The operation of the transistors 35, 36 may be enhanced by employing a low impedance driving source such as provided from the driver transformer 24 having primary winding 30 connected in a negative feedback loop from tap 26 to cathode 10. The construction and operation of this low impedance driver circuit is set forth in detail in applicant's copending application Serial No. 833,727, filed August 14, 1959. In brief, the feedback in the driver circuit provided by the connection from tap 26 is essentially a D.C. feedback loop (i.e., low phase shift) which permits a high amount of degenerative feedback to be applied and thus renders the output impedance of the driver circuit extremely low. As shown in the heinabove referenced copending application, this low impedance makes the operation of the transistors connected to the secondary winding 31 independent of beta, the current gain characteristic of the transistors, and thus the change in beta experienced for large signal excursions is not effective to introduce distortion in the audio output.

The operation of the circuit of the preferred embodiment will now be apparent to those skilled in the art. In particular, the adjustment of the position of the taps 49, 50 on the output transformer 46 may be selected to provide symmetrical clipping level in a push-pull circuit which requires only a single lead 51 connecting the load 52 to the transformer in addition to the ground lead which in most practical applications, such as automobile radios, need not be separately supplied, but may be made direct to chassis ground. Undistorted operation for small signals can be improved by selection of an off center position of tap 34 on the driver secondary winding 31 in order to compensate for the unequal turns ratio of the output turns between taps 49, 50 to the respective sides of the winding 46 on opposite sides of the tap 50. In addition to the circuit balance to obtain operation over the full transistor characteristic and maximum power output therefrom, the low impedance driver circuit connected to the primary winding 30 permits the transistors 35, 36 to operate substantially independent of changes in the beta value thereof over the full range of their characteristics and thus eliminates distortion due to this factor which would be exaggerated by the two transistors operating into different load impedances.

Obviously, NPN type transistors can be used in the circuit with the appropriate reversal of bias polarities. Many other modifications will now be apparent to those skilled in the art for the use of unbalanced connections to obtain a substantially balanced output for the purpose of achieving high quality operation with a maximum economy of components and manufacturing cost. Accordingly, such modifications that come within the scope of the appended claims are to be considered as being in accordance with the invention.

We claim:

1. An amplifier comprising a pair of transistors each having emitter, base and collector, means for driving said bases with asymmetrical push-pull signals, a single winding transformer having two end terminals and first and second spaced intermediate taps, said end terminals being connected to said collectors respectively, a direct current source, means connecting one terminal of said source to said emitters and the other terminal of said source to said first tap with said other terminal and said first tap at the same signal frequency potential, means for biassing said bases relative to said source, and a load connected between both of said taps.

2. The amplifier of claim 1 in which said first and second taps are substantially symmetrically spaced on opposite sides of the center of said winding.

3. The amplifier of claim 1 in which said other terminal of said source is a ground connection to said first tap and said load is a grounded load connected by a single lead to said second tap.

4. An amplifier comprising a pair of transistors each having emitter, base and collector, a driver transformer having a secondary winding with end terminals and an intermediate tap, said intermediate tap being positioned off the electrical center of said secondary winding, a connection between said end terminals respectively and said bases, an output transformer having a winding with end terminals connected to different ones of said collectors and spaced first and second taps, a direct current source, means connecting one terminal of said source to said emitters and the other terminal of said source to said first tap with said other terminal and said first tap at the same signal frequency potential, means for biassing said bases relative to said source by connection to said intermediate tap on said secondary winding and a load connected between said first and second taps.

5. The amplifier of claim 4 in which said first and second taps are prositioned to produce symmetrical clipping levels for said transistors.

6. In an automobile having a conductive chassis and a direct current source, one pole of which is connected to be common with said chassis, a radio receiver comprising an output amplifier having a pair of transistors each with emitter, base and collector, means for driving said bases with asymmetrical push-pull signals, a single winding audio transformer having two end terminals and first and second spaced intermediate taps, said end terminals being connected to said collectors respectively, a common potential connection between said one pole and said first tap, means connecting the remaining pole of said source to said emitters, means for biassing said bases relative to said source, a loud speaker remote from said transformer, a connection between said chassis and one terminal of said loud speaker at the remote location, and a single lead connecting the remaining terminal of said loud speaker to said second tap.

7. Apparatus according to claim 6 in which said first and second taps are positioned to produce symmetrical clipping levels in said transistors.

References Cited in the file of this patent

UNITED STATES PATENTS

| | | |
|---|---|---|
| 1,924,469 | Strecker | Aug. 29, 1933 |
| 2,162,389 | Ruston | June 13, 1939 |
| 2,609,509 | Hill | Sept. 2, 1952 |
| 2,839,620 | Waldhauer | June 17, 1958 |
| 2,932,800 | Bereskin | Apr. 12, 1960 |
| 2,946,015 | Byles | July 19, 1960 |

OTHER REFERENCES

Freedman et al.: "An Experimental Automobile Receiver Employing Transistors," Proc. IRE, June 1955, pages 671–678.